United States Patent [19]
Yanagisawa et al.

[11] Patent Number: 5,764,876
[45] Date of Patent: Jun. 9, 1998

[54] METHOD AND DEVICE FOR DETECTING A CYCLIC CODE

[75] Inventors: Shigeki Yanagisawa; Tetsuya Morizumi, both of Kouza-gun, Japan

[73] Assignee: Toyo Communication Equipment Co., Ltd., Kanagawa, Japan

[21] Appl. No.: 513,905

[22] PCT Filed: Jun. 22, 1994

[86] PCT No.: PCT/JP94/00998

§ 371 Date: Aug. 28, 1995

§ 102(e) Date: Aug. 28, 1995

[87] PCT Pub. No.: WO95/01683

PCT Pub. Date: Jan. 12, 1995

[30] Foreign Application Priority Data

Jun. 30, 1993 [JP] Japan ................................ 5-186622

[51] Int. Cl.$^6$ ................................................ H03M 7/30
[52] U.S. Cl. ................................ 395/182.04; 371/37.7
[58] Field of Search ........................ 364/514 R; 371/37.7, 371/37.1, 48, 2.1; 395/182.04, 185.01, 185.05

[56] References Cited

U.S. PATENT DOCUMENTS

| | | | |
|---|---|---|---|
| 4,566,105 | 1/1986 | Oisel et al. | 371/37.5 |
| 4,677,623 | 6/1987 | Iwasaki et al. | 371/39.1 |
| 5,046,069 | 9/1991 | Calvignac et al. | 371/53 |
| 5,303,245 | 4/1994 | Shikakura et al. | 371/37.1 |

FOREIGN PATENT DOCUMENTS 1149631  6/1989  Japan .

*Primary Examiner*—James P. Trammell
*Assistant Examiner*—Thomas Peeso
*Attorney, Agent, or Firm*—Koda & Androlia

[57] ABSTRACT

A method and device for detecting a cyclic code which detects an n-bit cyclic code or shortened cyclic code based on a degree-m generating polynomial or code with a predetermined bit pattern added to the cyclic code or shortened cyclic code in the bit sequence of a signal containing those codes by utilizing the principle that the remainder of division of those codes by the generating polynomial is zero or the added bit pattern.

The method divides serially input receive data by the generating polynomial successively, and removes the remainder of division of $X^n$ by the generating polynomial from the remainder of the division of the bits up to the current bit if the nth bit before the current bit is 1 for each of the nth bit from the first bit and subsequent bits of the receive data.

The device comprises a divider which divides serially input receive data by the generating polynomial successively and holds the remainder of the division hitherto performed, an n-stage shift register connected in parallel with the divider with respect to the input signal, and a decoder which receives the values of individual bits of the remainder calculated by the divider and outputs a predetermined detection signal when the values are all zero or form the predetermined bit pattern, and is constructed so as to remove the remainder of division of $X^n$ by the generating polynomial from the remainder calculated by the divider by utilizing the output signal of the last stage of the shift register when the value of the output of the last stage is 1.

4 Claims, 3 Drawing Sheets

+ means exclusive OR

METHOD AND DEVICE FOR DETECTING A CYCLIC CODE

BACKGROUND OF THE INVENTION

1) Field of the Invention

This invention relates to a method and device for detecting a cyclic code, and more specifically to means suitable for establishing synchronization in the ATM communication system.

2) Background Art

ATM (Asynchronous Transmission Mode), which is attracting attention as the switching system for broad-band ISDN (Integrated Services Digital Network), is a system which transmits data containing audio and visual information at a high speed by dividing it into predetermined length of blocks called cells and adding a header indicating the destination to each cell.

In the ATM system, a cell consists of 5 bytes for the header and 48 bytes for the information field, 53 bytes in total. The 5-byte or 40-bit header of a cell is a shortened cyclic code that consists of a 32-bit information point and an 8-bit checkpoint called HEC (Header Error Control).

The shortened cyclic code is generated in the following manner. First, 8 bits of 0s are concatenated to the 32 bits of the information bits to form a 40-bit code. Next, this 40-bit code is divided by generating polynomial $X^8+X^2+X+1$ to calculate the remainder. Since generating polynomial $X^8+X^2+X+1$ is 9 bits, the remainder is always equal to or less than 8 bits. This remainder is the check bits (CRC: Cyclic Redundancy Code). The remainder is then subtracted from the above 40-bit code (the result of bit-from-bit subtraction is equal to that of bit-to-bit addition). As the result, the previously added 8 bits of 0s are replaced by the remainder. In ATM, $X^6+X^4+X^2+1$ (bit pattern 01010101) is further added to the 40-bit codeword.

In ATM, boundaries between cells must be detected to correctly receive cells continuously on a transmission line at the receiving side. This process is called cell synchronization and performed by utilizing the header of cells. By dividing the 40 bits of the header of each cell by generating polynomial at the receiving side, $X^6+X^4+X^2+1$ that was added to the header at the transmitting side is obtained as the remainder. Detection of headers is performed by utilizing this principle.

When the receiver is not synchronized (in the hunting mode), it performs division on a 40-bit portion taken out of the received data one after another. If the remainder is $X^6+X^4+X^2+1$, the 40 bit portion is considered to be the header of a cell, and the receiver enters the pre-synchronization state (quasi-synchronized state).

If the remainder is not $X^6+X^4+X^2+1$, the same test is performed on the next 40 bits shifted by one bit. This test is repeated until the receiver enters the aforementioned pre-synchronization state.

In the pre-synchronization state, the receiver tests the 40 bits at the position 53 bytes (one cell) after the position considered at first to be the header of a cell for being a shortened cyclic code with $X^6+X^4+X^2+1$ added.

This test is performed on each possible cell. If the expected code is detected a predetermined number of times successively, then it is determined that the complete synchronization is established.

To implement the cell synchronization process described above, a divider 1 made up of an 8-bit feedback shift register as shown in FIG. 2 is used.

This divider 1 has exclusive OR circuits 5 put before the 1st stage, between the 1st and 2nd stages, and between the 2nd and 3rd stages of the shift register so that the result of the exclusive OR operation on the input to the 1st stage of the shift register and the fed back output of the last stage (8th stage) is input to the 1st stage, the result of the exclusive OR operation on the output of the 1st stage and the fed back output of the last stage is input to the 2nd stage, and the result of the exclusive OR operation on the output of the 2nd stage and the fed back output of the last stage is input to the 3rd stage.

These exclusive OR circuits 5 subtract the value of the output of the last stage from the value of the bit input to the shift register, the value of the output of the 1st stage, and the value of the output of the 2nd stage, respectively. Specifically, when the value of the last stage is 0, the value of the output of each exclusive OR circuit 5 is equal to that of the input bit, the output of the 1st stage, and the output of the 2nd stage, respectively. This corresponds to $1-0=1$ and $0-0=0$. When the value of the last stage is 1, the value of the output of each exclusive OR circuit 5 is equal to the inverted value of the input bit, the output of the 1st stage, and the output of the 2nd stage, respectively. This corresponds to $1-1=0$ and $0-1=1$. The function of these exclusive OR circuits can also be considered as addition ($1+0=1$, $0+0=0$, $1+1=0$ and $0+1=1$).

The operation of this divider 1 is as described below. Initially, 0 is set on all the stages of the shift register at the start of the operation. Then, input of received data is begun, and each time one bit is input, the exclusive OR signal on the input bit and the output of the last stage of the shift register is input to the 1st stage, the exclusive OR signal on the output of the 1st stage and that of the last stage is input to the 2nd stage, and the exclusive OR signal of the output of the 2nd stage and that of the last stage is input to the 3rd stage. The outputs of the third to seventh stages are input as they are to the subsequent stages of those stages.

Since the value on the last stage is always 0 and hence the output is 0 until eight bits of receive signal are input, the input bit to the shift register, the output of the 1st stage, and the output of the 2nd stage are input to the 1st, 2nd and 3rd stages, respectively, passing through the exclusive OR circuits 5 without conversion. After 8 bits of receive signal has been input, the values of the 1st to 8th bits are held by the stages of the shift register (1:5V, 0:0V).

Next, when the 9th bit is input, the input bit to the shift register, the output of the 1st stage and the output of the 2nd stage are inverted by the exclusive OR circuits 5 and input to the 1st, 2nd and 3rd stages, respectively, if the value of the last stage (the value of the 1st bit of the received data) is 1. The outputs of the 3rd to 7th stages are input as they are to the stages subsequent to those states. This is equivalent to regarding the 9 bits of the 1st bit (bit on the last stage of the shift register) to the 9th bit (bit to be input to the shift register) as a polynomial of X and calculating the remainder of division of the polynomial by generating polynomial $X^8+X^2+X+1$. As the result, the remainder of division of the 9 bits of the 1st to 9th bits of the received data by generating polynomial $X^8+X^2+X+1$ (8-bit polynomial) is held by the shift register.

If the value of the last stage of the shift register is 0, the values held by the shift register are shifted one stage, receiving the input bit as it is. As the result, the 8 bits of the 2nd to 9th bits of the receive data are held by the shift register. These bits can also be considered as the remainder of division of the 9 bits at the beginning of the received data by the generating polynomial (remainder when the quotient is 0).

Next, when the 10th bit is input, the remainder of the division by the generating polynomial on the 9 bits consisting of the 8 bits on the shift register (remainder of the division on the first 9 bits) and the input bit (10th bit) concatenated to the 8 bits is held on the shift register as the result of the same operation as described above, if the value of the last stage of the shift register (the value of the most significant bit of the remainder of the division on the 9 bits from the beginning).

If the value of the last stage of the shift register is 0, the values held by the shift register are shifted one stage as they are, receiving the input bit as it is (remainder when the quotient is 0).

When the nth bit is input, the remainder of division by the generating polynomial on the nth bits from the beginning is held by the shift register as the result of the repetition of the same operation.

The divider 1 thus performs division by the generating polynomial on the serially input receive signal and holds the remainder of the division hitherto performed.

Since the divider 1 operates as described above, the remainder of the division on 40 bits of received data is correctly obtained just when the first 40 bits have been input to the divider 1. However, when the next one bit is input, the remainder held by the divider becomes the remainder of the division on 41 bits of received data, not on the next 40 bits in the received data shifted by one bit, as shown in FIG. 3. Therefore, to always obtain the remainder of the division on the latest 40 bits in the received data, a method in which the remainder is not affected by the preceding bits is needed.

For the method of always obtaining the remainder of the division on the latest 40 bits in the received data, the following two methods can be thought of.

The first method is to form a 40-bit shift register by connecting a 32-bit shift register and the divider 1 in series, transfer the latest 40 bits in parallel from another 40-bit shift register to the first 40-bit shift register each time one bit is input to the another register, and perform the division on the 40 bits, as shown in FIG. 4.

In this method, however, the shift register which performs the division is required to operate 32 times as fast as the transmission rate on transmission line. Such a high speed operation is very difficult especially in wide-band ISDN which uses a very high speed transmission. Moreover, in high-speed circuits, it is very difficult to transfer 40 bits of data in parallel at the same timing, and hence generally the data delay in individual shift registers in the shift register must be adjusted to make the transfer timings simultaneous.

Another method is to connect 40 dividers, each constructed so as to be cleared every time when 40 bits are input, in parallel, input data serially to each of these 40 dividers clearing them at the timing staggered by one bit from each other in turn, and test the output of the divider the data fed to which has reached 40 bits, as shown in FIG. 5.

The problem with this method is that 40 dividers are needed and hence the size of the circuit becomes large.

This invention was made to solve the problems described above and provides a method and a device which can detect a cyclic code or shortened cyclic code of a predetermined length in a continuous bit sequence by means of a simple circuitry without need of high-speed circuits.

DISCLOSURE OF THE INVENTION

The first invention of this application is a method for detecting a cyclic code which detects an n-bit cyclic code or shortened cyclic code based on a degree-m generating polynomial or code with a predetermined bit pattern added to the cyclic code or shortened cyclic code in the bit sequence of a signal containing those codes by utilizing the principle that the remainder of division of those codes by the generating polynomial is zero or the added bit pattern, characterized by performing division by the generating polynomial on a serially input receive data successively, and removing the remainder of division of $X^n$ by the generating polynomial from the remainder of the division on the bits up to the current bit if the nth bit before the current bit is 1 for each of the nth bit from the beginning and subsequent bits of the receive data.

The second invention of this application is a method for detecting a cyclic code which detects an n-bit cyclic code or shortened cyclic code based on a degree-m generating polynomial or code with a predetermined bit pattern added to the cyclic code or shortened cyclic code in the bit sequence of a signal containing those codes by using the principle that the remainder of division of those codes by the generating polynomial is zero or the added bit pattern, characterized by comprising a divider which performs division by the generating polynomial on the serially input receive data successively and holds the remainder of the division hitherto performed, an n-stage shift register connected in parallel with the divider with respect to the input signal, and a decoder which receives the values of individual bits of the remainder calculated by the divider and outputs a predetermined detection signal when those values are all zero or form the predetermined bit pattern, and being constructed so as to remove the remainder of division of $X^n$ by the generating polynomial from the remainder calculated by the divider using the output signal of the last stage of the shift register when the value of the output of the last signal is 1.

PREFERRED EMBODIMENTS OF THE INVENTION

The present invention is described below in detail, taking for example an embodiment when the present invention is applied to the cell synchronization for ATM. This embodiment supposes that the generating polynomial G(X) is 9-bit $X^8+X^2+X+1$, that a cell consists of 5 bytes of header and 48 bytes of information field, 53 bytes in total, and that the header consists of 32 bits of information point and 8 bits of HEC.

Figure 1:
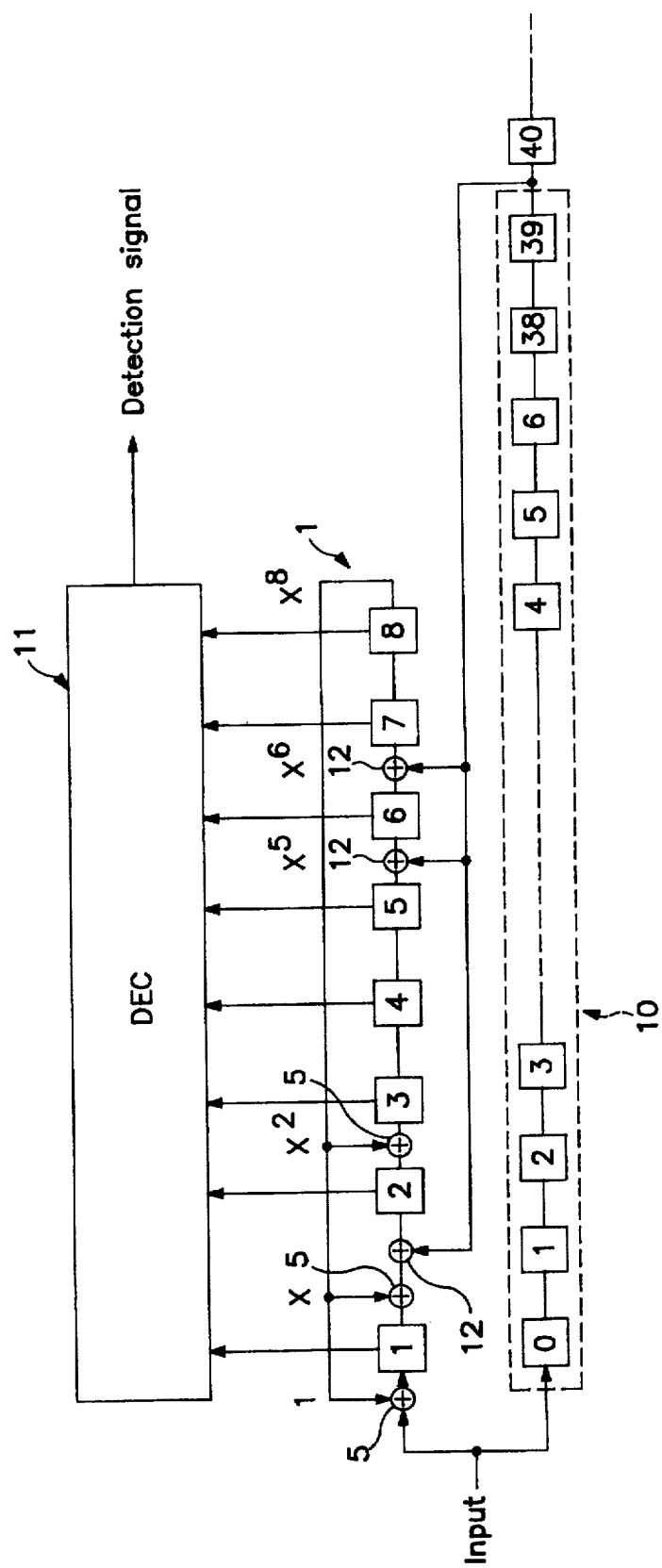
FIG. 1 is the structural diagram of an embodiment of this invention applied to the cell synchronization for ATM.
Figure 2:
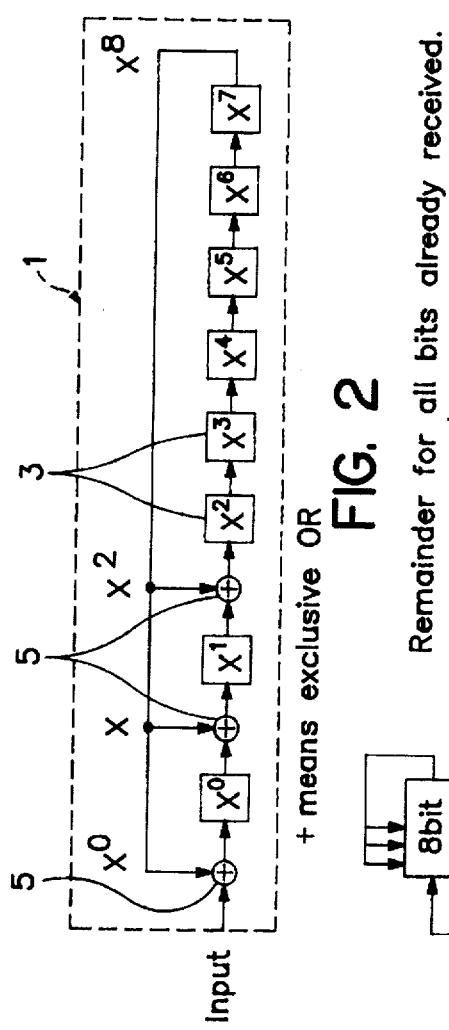
FIG. 2 is the structural diagram of an 8-bit feedback shift register which functions as a divider.
Figure 3:
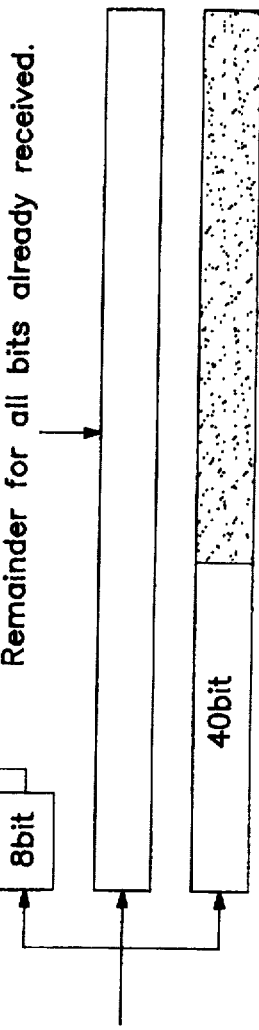
FIG. 3 is the structural diagram for explanation of problems to be solved.
Figure 4:
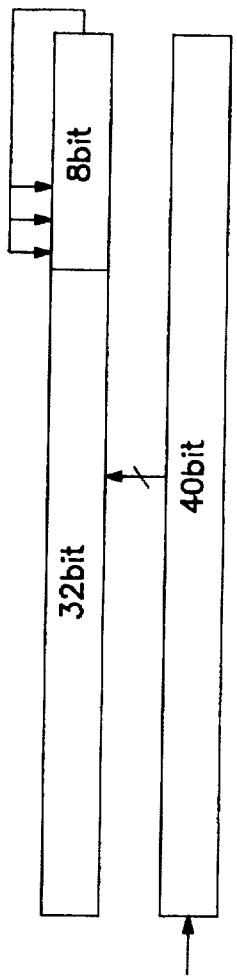
FIG. 4 is the structural diagram of the first method for solving the problems illustrated by FIG. 3.
Figure 5:
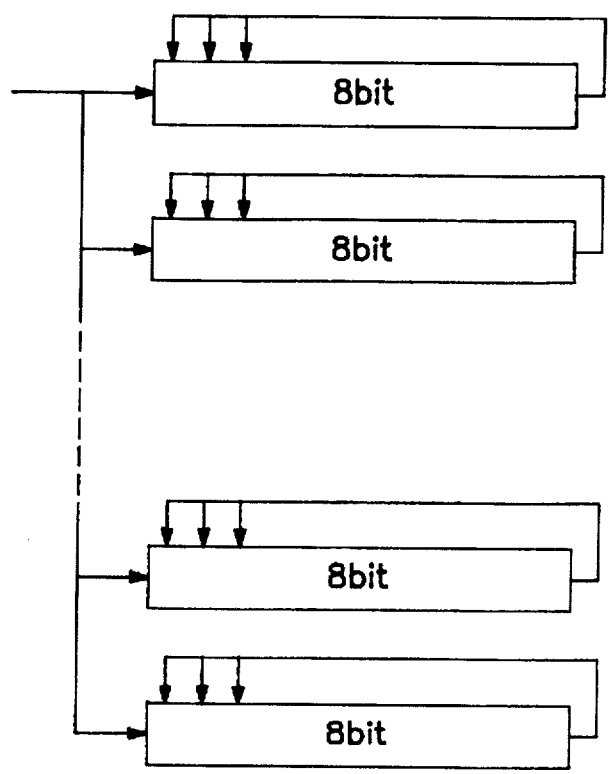
FIG. 5 is the structural diagram of the second method for solving the problems illustrated by FIG. 3.

FIG. 1 is the structural diagram of the principal part of a cyclic code detecting device which is an embodiment of the present invention applied to the cell synchronization for ATM.

This device comprises a divider 1 of the same structure as the one explained in the description of the problems with the conventional technology, a 40-stage shift register 10 connected in parallel with the divider 1 with respect to the input signal, and a decoder (DEC) 11 which receives the values of the individual stages of the divider 1 are input and outputs a predetermined detection signal when those values are all 0 (or the bit pattern added at the transmitting side if a predetermined bit pattern is added). The output of the shift register 10 is connected to one input of each of the exclusive OR circuits 12 put between the 1st and 2nd stages, between the 5th and 6th stages, and between the 6th and 7th stages of the divider 1. The two exclusive OR circuits 5 and 12 between the 1st and 2nd stages may be put in the reversed order (the result of subtracting first the output of the 8th stage of the divider 1 and then the output of the last stage of the shift register 10 from the output of the 1st stage is the same as that of subtracting first the output of the last stage of the shift register 10 and then the output of the 8th stage from the output of the 1st stage).

The operation of this device is as described below. All stages of the divider 1 and the shift register 10 are initialized to 0 at the beginning of the operation. Once input of receive data begins, the divider 1 performs division on the bit sequence of the serially input receive signal successively. The output of the last stage of the shift register 10 is always 0 until the 40th bit of the receive signal is input and hence does not affect the operation of the divider 1. When the 40th bit has been input, the remainder of division of the 40 bits from the beginning of the receive signal by the generating polynomial is held by the divider 1, and the 40 bits from the beginning are held on the stages of the shift register 10.

Next, when the 41st bit is input, the remainder of division of $X^{40}$ by the generating polynomial $X^8+X^2+X^1+1$ is subtracted from the remainder of division of the 41 bits from the beginning of the receive signal by the generating polynomial if the value of the last stage of the shift register 10 (the first bit of the receive data) is 1. As the result, the remainder held by the divider 1 becomes the remainder of the division on the 40 bits of the 2nd to 41st bit.

In the same manner for each of the subsequent bits, the remainder of division of $X^{40}$ by generating polynomial $X^8+X^2+X+1$ is subtracted from the remainder of the division calculated by the divider 1 (remainder of division by the generating polynomial on the 41 bits of ) if the value of the last stage of the 40-stage shift register (value of the bit at the position 40 bits before the current bit) is 1. As the result, the values held by the divider 1 becomes the remainder of the division on the 40 bits of the bit at the position 39 bits before the current bit to the current bit (latest 40 bits).

Therefore, if the bits of the receive data held by the 40-stage shift register 10 is the header of a cell, then the values of all stages of the divider 1 are 0 or the bit pattern added at the transmitting side if a predetermined bit pattern (01010101, for example) is added.

When the values of all stages of the divider 1 are 0 or the predetermined bit pattern, a predetermined signal indicating that a header has been detected is output by the decoder 11.

Though the above embodiment uses this invention for the detection of a shortened cyclic code in ATM, the application of this invention is not limited to this, and this invention can be widely used for detecting a cyclic code or shortened cyclic code based on a generating polynomial or code with a predetermined bit pattern added to the cyclic code or shortened cyclic code in the bit sequence of signals containing those codes.

Further, this invention can be realized by a simple circuitry without need of high-speed circuits.

What is claimed is:

1. A method for detecting a cyclic code which detects an n-bit cyclic code or shortened cyclic code based on a degree-m generating polynomial or code with a predetermined bit pattern added to said cyclic code or shortened cyclic code in the bit sequence of a signal containing those codes by utilizing the principle that the remainder of division of those codes by said generating polynomial is zero or the added bit pattern, characterized by dividing serially input receive data by said generating polynomial successively, and removing the remainder of division of $X^n$ by said generating polynomial from the remainder of the division of the bits up to the current bit if the nth bit before the current bit is 1 for each of the nth bit from the first bit and subsequent bits of the receive data.

2. A method for detecting a cyclic code which detects an n-bit cyclic code or shortened cyclic code based on a degree-m generating polynomial or code with a predetermined bit pattern added to said cyclic code or shortened cyclic code in the bit sequence of a signal containing those codes by utilizing the principle that the remainder of the division of those codes by said generating polynomial is zero or the added bit pattern, characterized by dividing serially input receive data by said generating polynomial successively, and removing the remainder of division of $X^n$ by said generating from the remainder of the division of the bits up to the current bit if the nth bit before the current bit is 1 for each of the nth bit from the first bit and the subsequent bits of the receive data; and wherein said generating polynomial is $X^8+X^2+X+1$, said shortened cyclic code is of 40 bits consisting of 32 bits of information bits and 8 bits of check bits, and said remainder of division of $X^n$ by said generating polynomial is $X^6+X^5+X$ (remainder of $X^{40}/(X^8+X^2+X+1)$).

3. A device for detecting a cyclic code which detects an n-bit cyclic code or shortened cyclic code based on a degree-m generating polynomial or code with a predetermined bit pattern added to said cyclic code or shortened cyclic code by utilizing the principle that the remainder of division of those codes by the generating polynomial is zero or the added bit pattern, characterized by comprising a divider which divides serially input receive data by said generating polynomial successively and holds the remainder of the division hitherto performed, an n-stage shift register connected in parallel with said divider with respect to the input signal, and a decoder which receives the values of individual bits of the remainder calculated by said divider and outputs a predetermined detection signal when the values are all zero or form said predetermined bit pattern, and being constructed so as to remove the remainder of division of $X^n$ by said generating polynomial from the remainder calculated by said divider by utilizing the output signal of the last stage of said shift register when the value of the output of the last stage is 1.

4. A device for detecting a cyclic code which detects an n-bit cyclic code or shortened cyclic code based on a degree-m generating polynomial or code with a predetermined bit pattern added to said cyclic code or shortened cyclic code by utilizing the principle that the remainder of the division of those codes by the generating polynomial is zero or the added bit pattern, characterized by comprising a divider which divides serially input receive data by said generating polynomial successively and holds the remainder of the division hitherto performed, an n-stage shift register connected in parallel with said divider with respect to the input signal, a decoder which receives the values of individual bits of the remainder calculated by said divider and outputs a predetermined detection signal when the values are all zero or form said predetermined bit pattern, and being constructed so as to remove the remainder of division of $X^n$ by said generating polynomial from the remainder calculated by said divider by utilizing the output signal of the last stage of said shift register when the value of the output of the last stage is 1; and wherein said divider is a divider which divides the serially input bit sequence of receive data by generating polynomial $X^8+X^2+X+1$ successively and said shift register is a 40-stage shift register with the output of the last stage being connected to one input of the exclusive OR circuits put between the stages of said divider corresponding to the bits of the remainder of division of $X^{40}$ by generating polynomial $X^8+X^2+X+1$ whose value is 1 (bits $X^6$, $X^5$ and X) and their preceding stages (between the 1st and 2nd stages, the 5th and 6th stages, and the 6th and 7th stages).

* * * * *